United States Patent
Ishida

(10) Patent No.: US 7,210,831 B2
(45) Date of Patent: May 1, 2007

(54) VEHICLE ILLUMINATION LAMP

(75) Inventor: Hiroyuki Ishida, Shizuoka (JP)

(73) Assignee: Koito Manufacturing Co., Ltd., Tokyo (JP)

(*) Notice: Subject to any disclaimer, the term of this patent is extended or adjusted under 35 U.S.C. 154(b) by 14 days.

(21) Appl. No.: 11/254,776

(22) Filed: Oct. 21, 2005

(65) Prior Publication Data
US 2006/0087862 A1 Apr. 27, 2006

(30) Foreign Application Priority Data
Oct. 27, 2004 (JP) ............ P.2004-311816

(51) Int. Cl.
F21S 8/10 (2006.01)
(52) U.S. Cl. ............ 362/539; 362/507; 362/540
(58) Field of Classification Search ........... 362/539, 362/497, 498, 499, 507, 521, 540, 541, 542
See application file for complete search history.

(56) References Cited

U.S. PATENT DOCUMENTS 5,388,035 A * 2/1995 Bodem, Jr. ............ 362/545
5,438,487 A * 8/1995 Schmid et al. ............ 362/460

FOREIGN PATENT DOCUMENTS

JP 2004-95480 A 3/2004

* cited by examiner

Primary Examiner—Sandra O'Shea
Assistant Examiner—Sharon Payne
(74) Attorney, Agent, or Firm—Sughrue Mion, PLLC

(57) ABSTRACT

A vehicle illumination lamp including a projection lens 14 disposed on an optical axis Ax extending in a longitudinal direction of a lamp and a light-emitting element 12 disposed to the rear of the projection lens 14. The light-emitting element has a light-emitting chip 22 disposed adjacently to the rear of a rear focal point F of the projection lens on the optical axis Ax; a translucent cover 26 for covering the light-emitting chip from the front side thereof with a predetermined clearance therefrom; and a light-shielding film 28 formed on a lower region of the translucent cover. In this configuration, the translucent cover is disposed so as to intersect the optical axis Ax at the rear focal point F; and the light-shielding film is formed such that an upper edge 28a thereof passes through the rear focal point F.

8 Claims, 9 Drawing Sheets

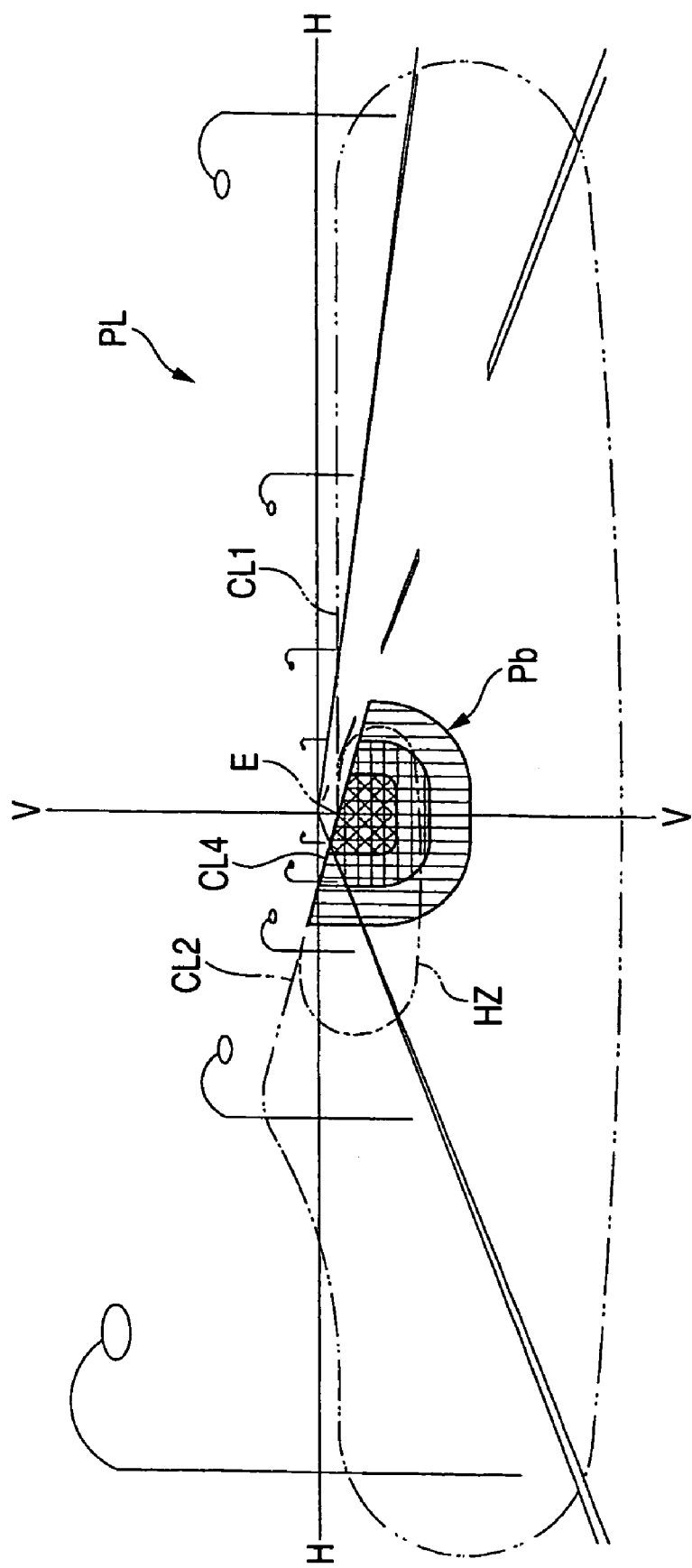

VEHICLE ILLUMINATION LAMP

This application claims foreign priority from Japanese Patent Application No. 2004-311816, filed Oct. 27, 2004, the entire disclosure of which is herein incorporated by reference.

BACKGROUND OF THE INVENTION

1. Field of the Invention

The present invention relates to a vehicle illumination lamp employing a light-emitting element, such as a light-emitting diode, as a light source.

2. Description of Related Art

In recent years, an illumination lamp employing a light-emitting element, such as a light-emitting diode, as a light source has been developed as a vehicle illumination lamp, such as a headlamp.

In relation to the above, Japanese Patent-Publication 2004-95480 discloses a vehicle illumination lamp in which a projection lens is disposed on an optical axis extending in a longitudinal direction of the lamp, and in which a light-emitting element is disposed to the rear of the projection lens.

In the vehicle illumination lamp disclosed in JP 2004-95480, the light-emitting element is disposed adjacent to the rear of a near focal point of the projection lens on the optical axis. A shade for shielding light originating from the light-emitting element is disposed adjacent before the light-emitting element in such a manner that an upper edge of the shade passes through the rear focal point of the projection lens. In addition, the vehicle illumination lamp is configured such that light originating from the light-emitting element is illuminated forward through the projection lens, to thus form a light distribution pattern as a reversed projection image of an image of the light source which is formed on a rear focal plane of the projection lens; and, in conjunction therewith, to form a cutoff line as a reversed projection image of the upper edge of the shade.

However, the light-emitting element of the vehicle illumination lamp disclosed in JP 2004-95480 is configured such that the light-emitting chip is sealed by a substantially hemispherical sealing resin member. Accordingly, the image of the light source formed from light-originating from the light-emitting element on the rear focal plane of the projection lens is enlarged by means of a convex lens. Hence, there arises a problem that a light distribution pattern having a sharp cutoff line cannot be formed.

The present invention has been conceived in view of the above circumstances, and aims at providing a vehicle illumination lamp, which employs a light-emitting element as a light source, being capable of forming a light distribution pattern having a sharp cutoff line.

SUMMARY OF THE INVENTION

The invention aims at achieving the above object by employing a configuration in which, in place of the sealing resin member employed in the related art, a translucent member for covering a light-emitting chip from the front side thereof is disposed with a predetermined clearance therebetween; and a given light-shielding film is formed on the translucent cover.

More specifically, a vehicle illumination lamp according to the invention is a vehicle illumination lamp having a projection lens disposed on an optical axis extending in a longitudinal direction of the lamp, and a light-emitting element disposed to the rear of the projection lens. The light-emitting element has a light-emitting chip disposed adjacently to the rear of the rear focal point of the projection lens on the optical axis, a translucent cover for covering the light-emitting chip from the front-side thereof with a predetermined clearance from the light-emitting chip, and a light-shielding film formed on a lower region of the translucent cover. The translucent cover is disposed so as to intersect the optical axis on the rear focal point; and the light-shielding film is formed such that an upper edge of the light-shielding film passes through the rear focal point.

The vehicle illumination lamp is not limited to any specific type. For instance, there can be employed a headlamp, a fog lamp, a cornering lamp, a daytime running lamp, or the like; or a lamp unit which forms a portion thereof, or the like.

The light-emitting element can be an element-like light source having a light-emitting chip which illuminates substantially in the form of a point, and is not limited to any specific type. For instance, a light-emitting diode, a laser diode, or the like can be employed.

No specific limitation is imposed on specific configuration, such as the surface shape, and the outer shape, of the translucent cover, so long as the translucent cover covers the light-emitting chip from the front side thereof with a predetermined clearance from the light-emitting chip, and is disposed so as to intersect the optical axis on the rear focal point of the projection lens.

The above-mentioned predetermined clearance is not limited to any specific value. However, in view of increasing sharpness of the cutoff line, the predetermined clearance is preferably set to as small a value as possible.

The light-shielding film is not limited to any specific configuration, so long as the film is formed such that the upper edge thereof passes through the rear focal point of the projection lens. The light-shielding film may be formed by means of performing a surface treatment, such as coating or deposition, on an outer surface or an inner surface of the translucent cover; or by configuring a portion of the translucent cover opaque.

BRIEF DESCRIPTION OF THE DRAWINGS

The advantages, nature and various additional features of the invention will appear more fully upon consideration of the exemplary embodiment of the invention and modifications thereof, which are schematically set forth in the drawings, in which:

FIG. 8 is a perspective view illustrating a light distribution pattern formed from light illuminated forward from the vehicle illumination lamp according to the first modification on the virtual vertical screen.

DETAILED DESCRIPTION OF THE EXEMPLARY EMBODIMENT

Although the invention will be described below with reference to the exemplary embodiment and modifications thereof, the following exemplary embodiment and modifications do not restrict the invention.

As to the term of "translucent" in this invention, it is noted that said term shall be construed rather broadly such as to cover the meaning of "transparent" whose optical characteristic might be included in the definition of "translucent" that is known for a person skilled in the art.

Figure 1:
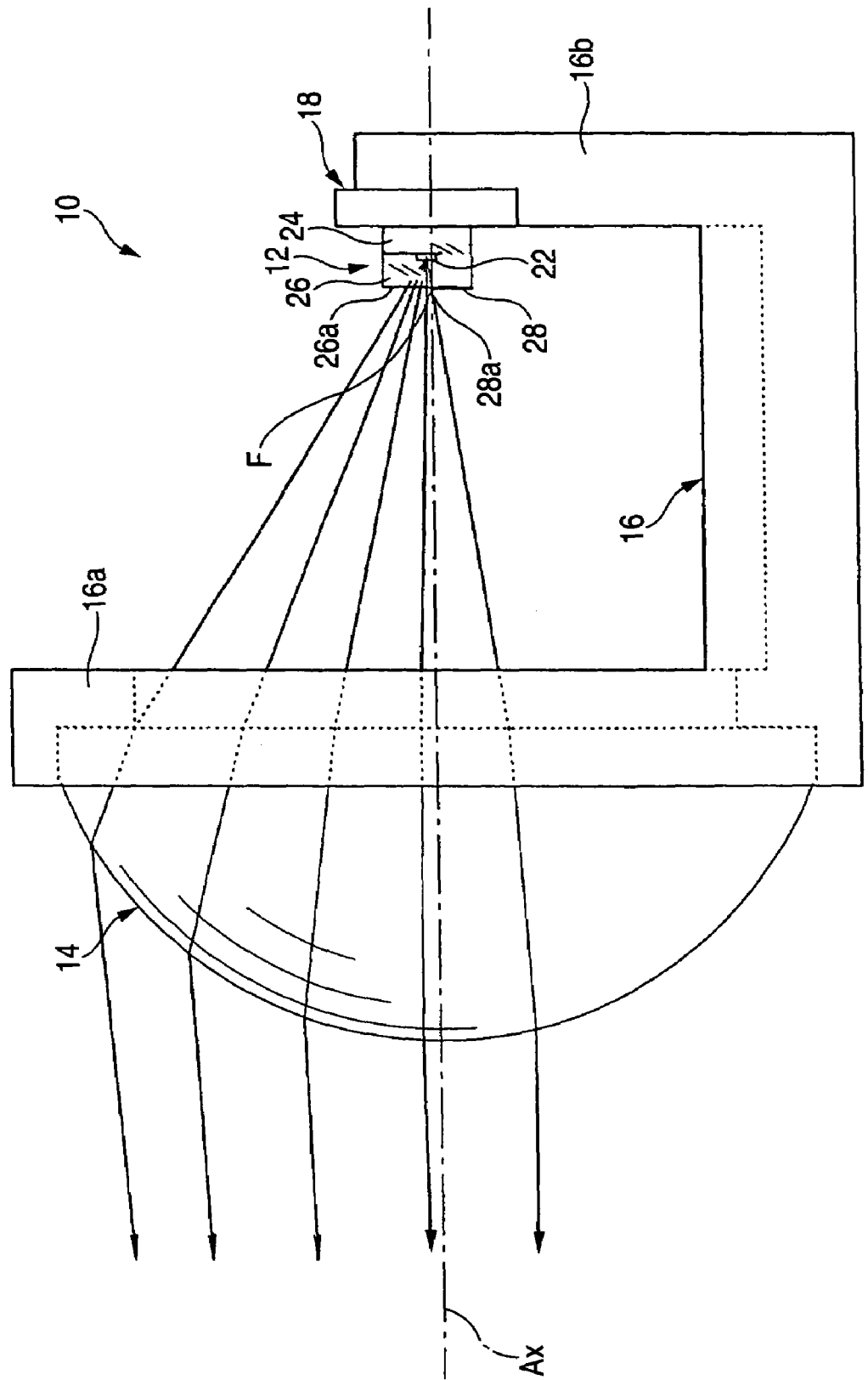
FIG. 1 is a side view illustrating a vehicle illumination lamp according to an exemplary embodiment of the present invention.
Figure 2:
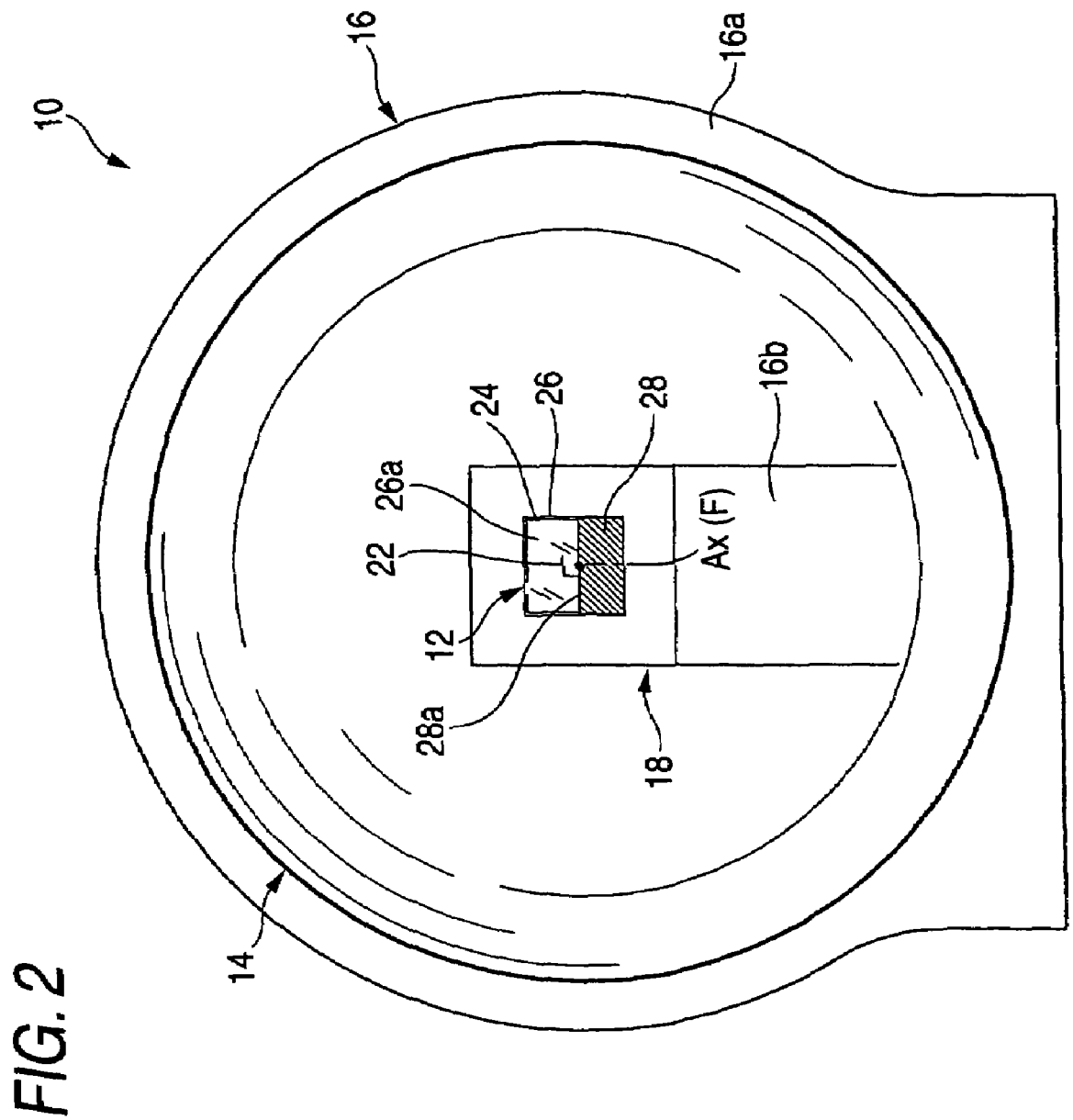
FIG. 2 is a front view illustrating the vehicle illumination lamp.

FIG. 1 is a side view illustrating a vehicle illumination lamp 10 according to an exemplary embodiment of the invention. FIG. 2 is a front view of the same.

As illustrated in the drawings, the vehicle illumination lamp 10 is a lamp unit to be used as a portion of a headlamp. The vehicle illumination lamp 10 comprises a light-emitting element 12 and a projection lens 14. The projection lens 14 is disposed on an optical axis Ax extending in the longitudinal direction of the lamp and is supported on a bracket 16. The light-emitting element 12 is disposed to the rear of the projection lens 14 and is supported on the bracket 16 via a support plate 18.

The vehicle illumination lamp 10 is configured such that, when it is assembled into a headlamp, the optical axis Ax extends in a direction oriented approximately 0.5 to 0.6 degrees downward in relation to the longitudinal direction of the vehicle.

An annular lens support section 16a, which supports the projection lens 14 and which constitutes an aperture diaphragm, is formed on the front end of the bracket 16. In addition, a plate support section 16b for supporting and positioning the support plate 18 is formed on the rear end of the bracket 16.

The projection lens 14 is formed from a plano-convex lens having a convex surface on the front surface and a planar surface on the rear surface, and projects an image on a focal plane including a rear focal point F as a reversed image on a virtual vertical screen placed ahead of the lamp.

The light-emitting element 12 is a white light-emitting diode having a light-emitting chip 22, a base member 24 for mounting the light-emitting chip 22 thereon, and a translucent cover 26 for covering the light-emitting chip 22 from the front side thereof.

Figure 3:
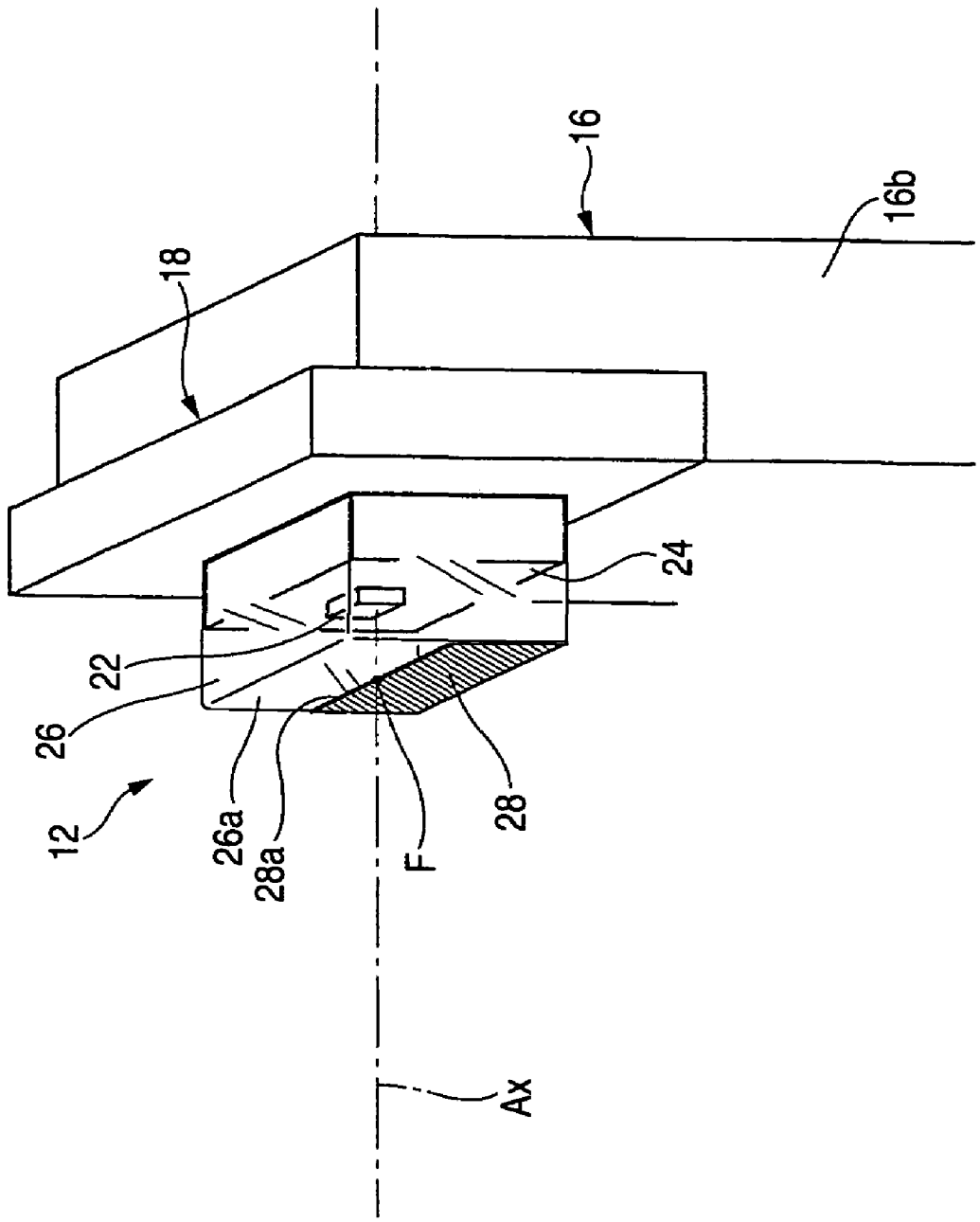
FIG. 3 is a perspective view illustrating a light-emitting element of the vehicle illumination lamp and peripheral members thereof in detail.

FIG. 3 is a perspective view illustrating the light-emitting element 12 and peripheral members thereof in detail.

As also illustrated in the drawing, the light-emitting element 12, which measures about 0.3 to 3 mm square in front view, is disposed adjacently to the rear of the rear focal point F of the projection lens 14 on the optical axis Ax (e.g., at a position about 0.5 to 3 mm to the rear of the rear focal point F) so as to face forward.

The base member 24 has an external shape of a square when viewed from the front. The base member 24 is fixed to the support plate 18 in such a manner as to displace the luminance center of the light-emitting chip 22 slightly upward (e.g., by a distance of about one-quarter to one-third of the height dimension of the light-emitting chip 22) from the optical axis Ax.

The translucent cover 26 is formed by molding a transparent thin plate of a synthetic resin into a substantially rectangular solid shape, and the translucent cover 26 is fixed to the base member 24 from the front side thereof. The translucent cover 26 has a planar section 26a which orthogonally intersects the optical axis Ax at the rear focal point F. In other words, the planar section 26a is disposed so as to have a predetermined clearance from the light-emitting chip 22. More specifically, the clearance between a rear face of the planar section 26a and a front face of the light-emitting chip 22 is set to a value of about 0.5 to 3 mm.

A light-shielding film 28 is formed on a lower region of the planar section 26a of the translucent cover 26. The light-shielding film 28 extends rectilinearly and in the horizontal direction in such a manner that an upper edge 28a thereof passes through the rear focal point F. The light-shielding film 28 is formed by applying and forming a light-shielding coating on an outer surface of the translucent cover 26. Examples of the light-shielding coating include filler-containing aqueous-based coating having been prepared to have a viscosity which falls within the range of 0.1 to 2 Pa·s.

Next, working effects yielded by the exemplary embodiment of the present embodiment will be described.

In the vehicle illumination lamp 10, a portion of light originating from the light-emitting chip 22 of the light-emitting element 12 and propagating toward the projection lens 14 is shielded by the light-shielding film 28 as indicated by optical paths of light originating from the luminous center of the light-emitting chip 22 in FIG. 1. In this configuration, the light-shielding film 28 is formed such that the upper edge 28a thereof passes through the rear focal point F and extends in the horizontal direction; and the luminous center of the light-emitting chip 22 is displaced slightly upward from the optical axis Ax. Accordingly, light originating from the luminous center oriented downward by a certain angle or more is shielded by the light-shielding film 28.

Figure 4:
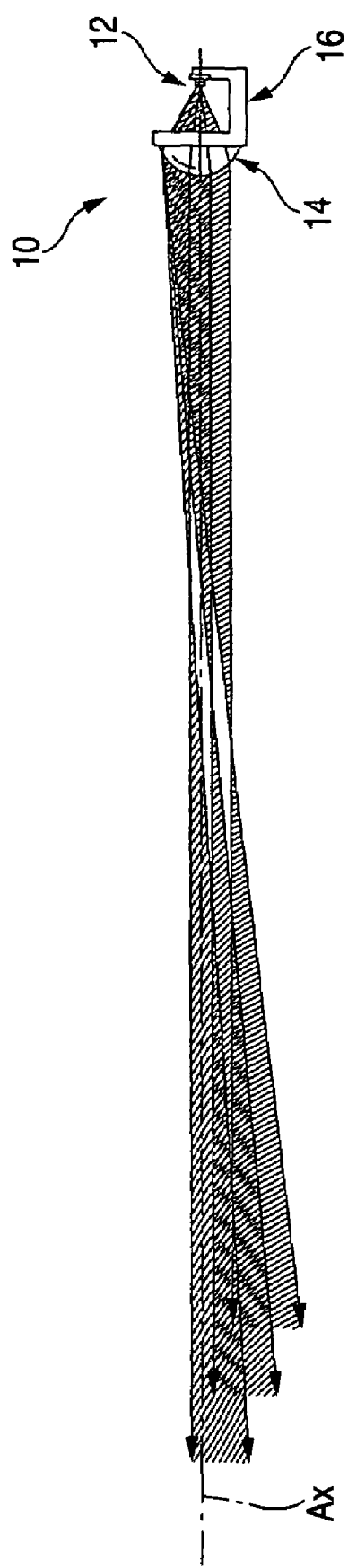
FIG. 4 is a side view illustrating optical paths of light illuminated from the vehicle illumination lamp.
Figure 5:
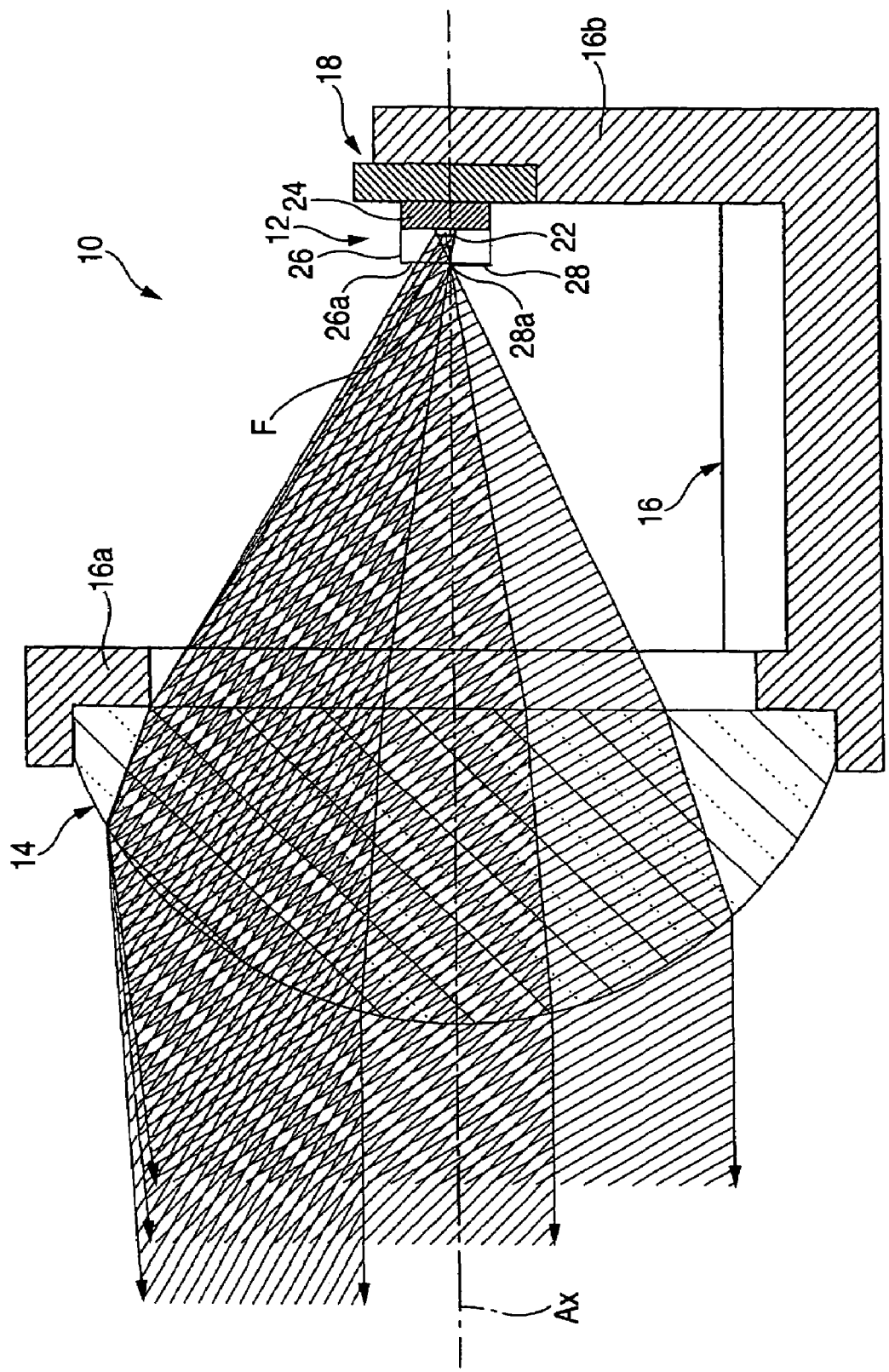
FIG. 5 is a side cross-sectional view illustrating an essential portion of the optical paths of light illuminated from the vehicle illumination lamp.

FIG. 4 is a side view illustrating optical paths of light illuminated from the vehicle illumination lamp 10 according to the present exemplary embodiment. FIG. 5 is a side cross-sectional view illustrating the essential portion of the same.

These drawings illustrate not only the optical paths of light originating from the luminous center of the light-emitting chip 22, but also the optical paths of light originating from an upper edge and a lower edge of the light-emitting chip 22.

As illustrated in these drawings, within a vertical plane including the optical axis Ax, light to enter the projection lens 14, among light originating from respective points of the light-emitting chip 22, is light within angular ranges indicated by hatched patterns.

More specifically, the upper edge 28a of the light-shielding film 28 is formed so as to pass through the rear focal point F. Accordingly, among the light originating from the respective points of the light-emitting chip 22, light to enter the projection lens 14 while passing through the upper edge 28a becomes light parallel with the optical axis Ax. Meanwhile, light to enter the projection lens 14 at an upper end of the inner peripheral edge of the lens support section 16a of the bracket 16 becomes light oriented slightly downward in relation to the optical axis Ax.

Figure 6:
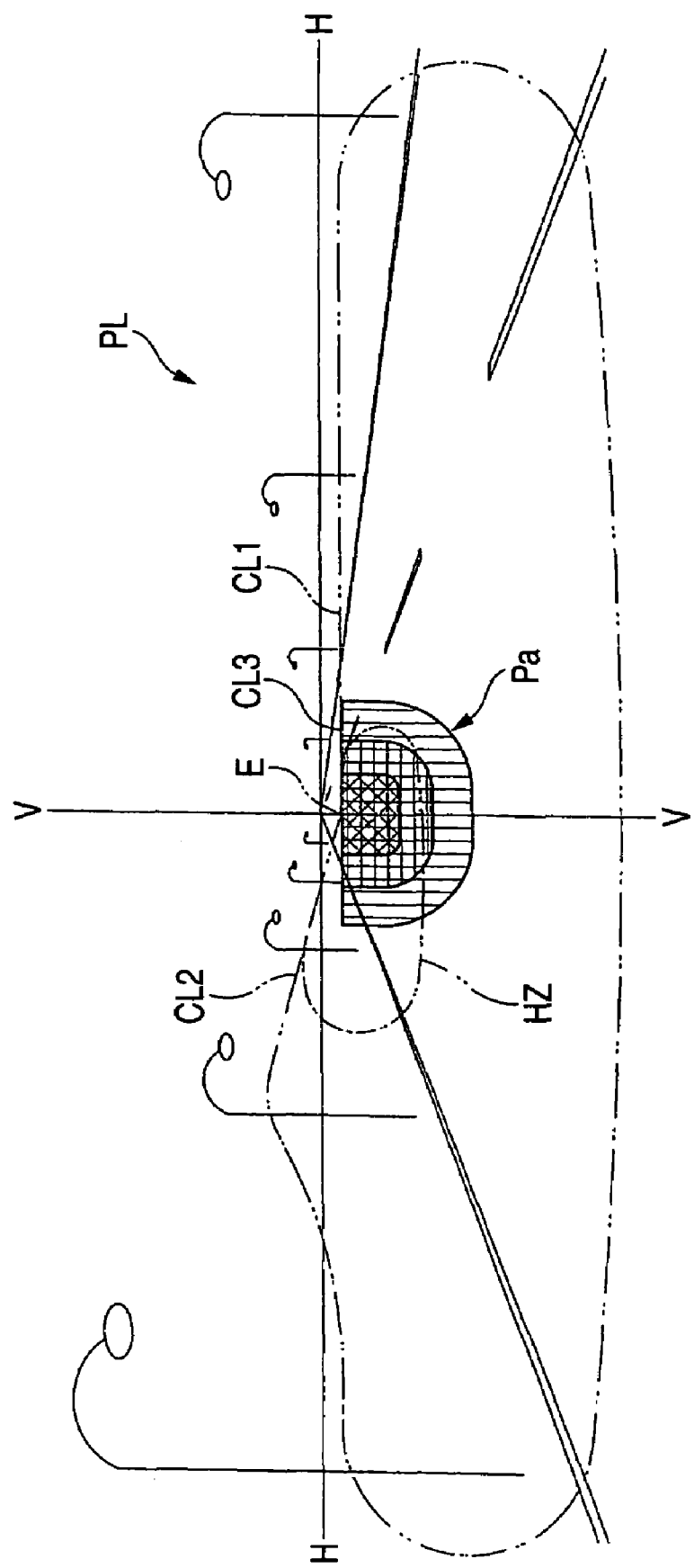
FIG. 6 is a perspective view illustrating a light distribution pattern formed from light illuminated forward from the vehicle illumination lamp on a virtual vertical screen placed at a position 25 m ahead of the vehicle.

FIG. 6 is a perspective view illustrating a light distribution pattern Pa formed from light illuminated forward from the vehicle illumination lamp 10 on a virtual vertical screen placed at a position 25 m ahead of the vehicle.

As illustrated in the drawing, the light distribution pattern Pa is formed as a portion of a low-beam light distribution pattern PL indicated by a line constituted of short and long dashes in the drawing. The low-beam light distribution pattern PL is a light distribution pattern formed from light illuminated from the entire headlamp including the vehicle illumination lamp 10.

The low-beam light distribution pattern PL is a left-oriented low-beam light distribution pattern. The low-beam light distribution pattern PL has a horizontal cutoff line CL1, and an oblique cutoff line CL2 at an upper edge thereof. An elbow point E, which is a point of intersection of the cutoff lines CL1 and CL2, is set to a location situated slightly below (more specifically, about 0.5 to 0.6 degrees below) a point H-V, which is a vanishing point in the frontward direction of the vehicle. A hot zone HZ is formed in the low-beam light distribution pattern PL so as to surround the elbow point E within an area slightly to the left thereof.

Meanwhile, the light distribution pattern Pa is a spot-like light distribution pattern formed below and in the vicinity of the elbow point E. The light distribution pattern Pa has, at an upper edge thereof, a horizontal cutoff line CL3 which extends in the horizontal direction. The horizontal cutoff line CL3 is formed as a reversed projection image of the upper edge 28a of the light-shielding film 28. The light distribution pattern Pa contributes to formation of the hot zone HZ of the low-beam light distribution pattern PL.

The light distribution pattern Pa is formed so that the horizontal cutoff line CL3 is located at a vertical level substantially equal to that of the horizontal cutoff line CL1. This is because the optical axis Ax is disposed so as to extend in a direction oriented approximately 0.5 to 0.6 degrees downward with respect to the longitudinal direction of the vehicle.

Mean while, in the light distribution pattern Pa, a plurality of curves formed substantially concentrically with a curve representing the outline of the light distribution pattern Pa are iso-intensity curves. The iso-intensity curves indicate that the light distribution pattern Pa gradually becomes brighter from the outer peripheral edge to the center thereof.

As described above in detail, the vehicle illumination lamp 10 according to the present embodiment has the projection lens 14 disposed on the optical axis Ax extending in the longitudinal direction of the lamp, and the light-emitting element 12 disposed to the rear of the projection lens 14. The light-emitting element 12 has the light-emitting chip 22 disposed adjacently to the rear of the rear focal point F of the projection lens 14 on the optical axis Ax; the translucent cover 26 for covering the light-emitting chip 22 from the front side thereof with a predetermined clearance from the light-emitting chip 22; and the light-shielding film 28 formed on the lower region of the translucent cover 26. Meanwhile, the translucent cover 26 is disposed so as to intersect the optical axis Ax at the rear focal point F; and the light-shielding film 28 is formed such that the upper edge 28a thereof passes through the rear focal point F and extends in the horizontal direction. Accordingly, the following working effects can be yielded.

Namely, by means of illuminating light originating from the light-emitting element 12 in the forward direction via the projection lens 14, the light distribution pattern Pa is formed as the reversed projection image of the image of the light source (more specifically, the image of the light-emitting chip 22) which is formed on the rear focal plane thereof; and, in conjunction therewith, the horizontal cutoff line CL3 is also formed as the reversed projection image of the upper edge 28a of the light-shielding film 28, which is formed on the translucent cover 26.

Furthermore, for the light-emitting element 12, in contrast to the related-art configuration in which a light-emitting chip is sealed by a substantially hemispherical sealing resin member, there is employed the configuration in which the light-emitting chip 22 is covered by the translucent cover 26 from the front side thereof with the predetermined clearance from the light-emitting chip 22. Accordingly, the image of the light source formed on the rear focal plane of the projection lens 14 can be prevented from being enlarged, thereby attaining formation of the light distribution pattern Pa having the sharp horizontal cutoff line CL3.

Thus, according to the present exemplary embodiment, the vehicle illumination lamp 10, which employs the light-emitting element 12 as a light source, can form the light distribution pattern Pa having the sharp horizontal cutoff line CL3.

Furthermore, in the present exemplary embodiment, the light-shielding film 28 which plays the role of a related-art shade is configured as a portion of the light-emitting element 12. Therefore, in contrast to the related art, the need for disposition of a shade as another member in addition to the light-emitting element can be negated.

In the exemplary embodiment, since the translucent cover 26 is configured to have the planar section 26a which orthogonally intersects the optical axis Ax at the rear focal point F of the projection lens 14, the light-shielding film 28 can be formed relatively easily. In addition, by virtue of this configuration, the positional accuracy of the upper edge 28a of the shielding film 28 can be enhanced, thereby also enhancing the accuracy of the position where the cutoff line is to be formed. Furthermore, as described above, by configuring the translucent cover 26 so as to have the planar section 26a which orthogonally intersects the optical axis Ax at the rear focal point F of the projection lens 14, the light-shielding film 28 can be disposed substantially along the rear focal plane of the projection lens 14. Thus, the sharpness of the cutoff line CL3 can be further enhanced.

In addition, in the present exemplary embodiment, the light-emitting chip 22 is disposed so as to displace the luminance center thereof upward in relation to the optical axis Ax. Accordingly, the ratio of light to be shielded by the light-shielding film 28, among light originating from the light-emitting chip 22 and propagating toward the projection lens 14, can be suppressed to a low value. By virtue of this configuration, there can be more light flux for effective use in formation of the light distribution pattern Pa.

The above exemplary embodiment has been described based on the assumption that the clearance between the rear face of the planar section 26a of the translucent cover 26 and the front face of the light-emitting chip 22 is set to a value of about 0.5 to 3 mm. However, in view of further enhancing the sharpness of the cutoff line CL3, the light-shielding film 28 is preferably disposed at as close a position as possible to the light-emitting chip 22. More specifically, the clearance is preferably set to a value of about 0.5 to 2 mm, more preferably about 0.5 to 1 mm.

The above exemplary embodiment has been described based on the assumption that the light-emitting chip 22 of the light-emitting element 12 is formed into a square measuring about 0.3 to 3 mm per side. However, a light-emitting chip formed into another external shape (e.g., a horizontally-elongated rectangular shape) can also be employed. When such a configuration is employed, there can be formed a light distribution pattern which differs from the light distribution pattern Pa in size or shape, depending on the size or the shape of the light-emitting chip 22.

The above exemplary embodiment has been described based on the assumption that the translucent cover 26 is fixed to the base member 24 in a state of being fitted into the base member 24 from the front side thereof. However, another fixing structure can be employed. In this case, there can be employed such a configuration that a space formed from the translucent cover 26 and the base member 24 is formed as a sealed space; and nitrogen, or the like, is filled in the sealed space.

The above exemplary embodiment has been described in relation to a case where a single vehicle illumination lamp 10 is assembled as a portion of a headlamp. However, a plurality of vehicle illumination lamps 10 can be assembled as a portion of a headlamp. In this case, when the optical axes Ax of the respective vehicle illumination lamps 10 are arranged so as to be slightly displaced from each other, a plurality of light distribution patterns Pa can be formed so as to partially overlap one another.

Next, modifications of the exemplary embodiment will be described.

First, a first modification of the present invention will be described.

Figure 7:
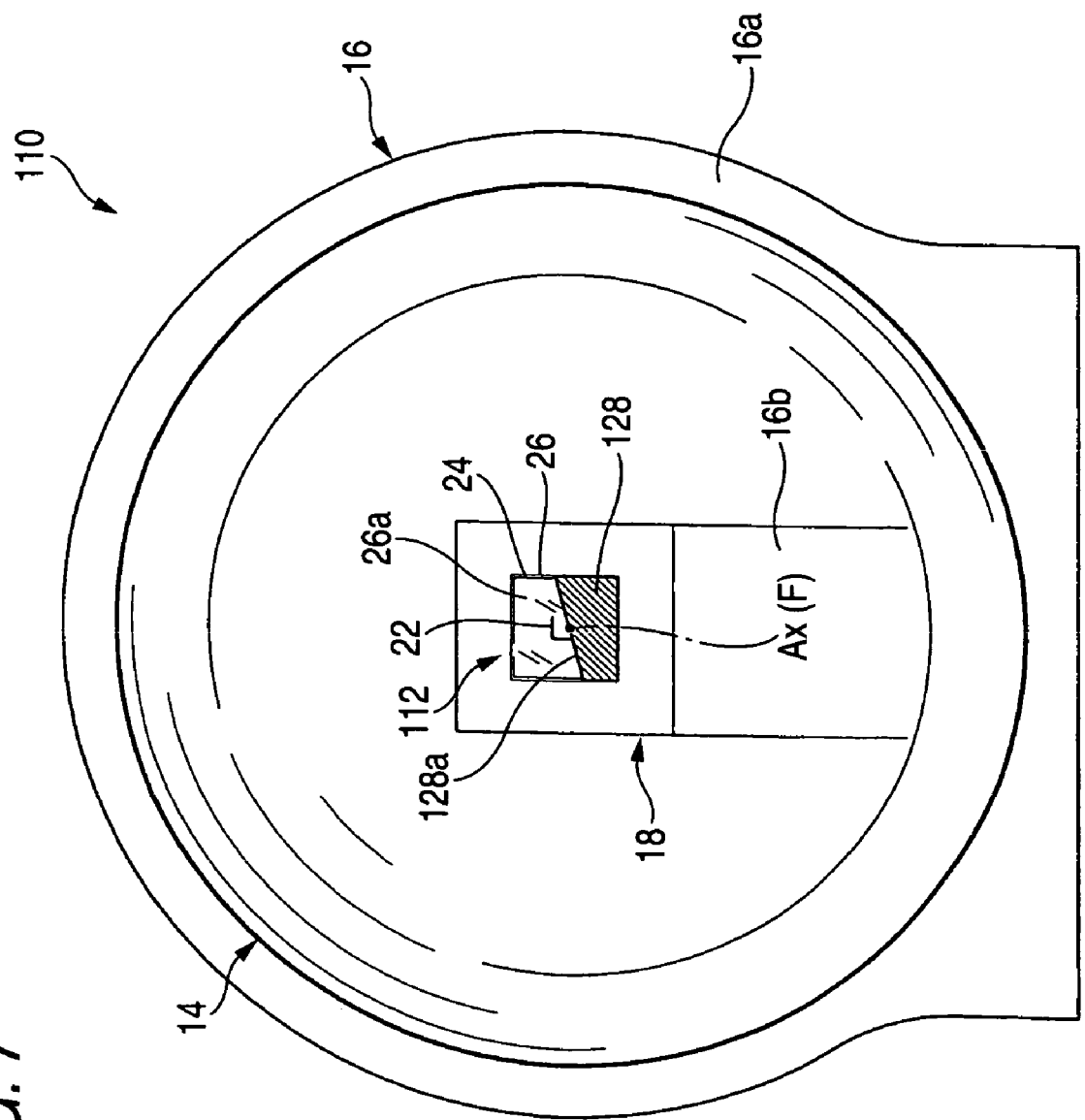
FIG. 7 is a front view illustrating a vehicle illumination lamp according to a first modification of the exemplary embodiment.

FIG. 7 is a front view illustrating a vehicle illumination lamp 110 according to the present modification.

As illustrated in the drawing, the vehicle illumination lamp 110 has a light-emitting element 112 which differs in configuration from the light-emitting element 12 of the above embodiment. However, the remaining elements are completely analogous in configuration with those of the above embodiment.

The light-emitting element 112 of the present modification differs from the light-emitting element 12 of the above embodiment in the shape of an upper edge 128a of a light-shielding film 128.

More specifically, the upper edge 128a of the light-shielding film 128 rectilinearly extends in a direction tilted upwardly to the left (a direction tilted upwardly to the right when the lamp is viewed from the front) by a predetermined angle in relation to the horizontal direction so as to pass through the rear focal point F. Meanwhile, in other respects the light-emitting element 112 is completely analogous in configuration with the light-emitting element 12 of the above embodiment.

FIG. 8 is a perspective view illustrating a light distribution pattern Pb formed from light illuminated forward from the vehicle illumination lamp 110 according to the present modification on a virtual vertical screen placed at a position 25 m ahead of the vehicle.

As illustrated in the drawing, the light distribution pattern Pb is also formed, as a portion of the low-beam light distribution pattern PL indicated by a line constituted of short and long dashes, into a spot-like light distribution pattern formed below and in the vicinity of the elbow point E. However, the light distribution pattern Pb has, at an upper edge thereof, an oblique cutoff line CL4 which extends in a direction tilted upwardly to the left by a predetermined angle in relation to the horizontal direction. The oblique cutoff line CL4 is formed as a reversed projection image of the upper edge 128a of the light-shielding film 128. The light distribution pattern Pb contributes to formation of the hot zone HZ of the low-beam light distribution pattern PL.

The light distribution pattern Pb is formed such that the oblique cutoff line CL4 is located at a vertical level substantially equal to that of the oblique cutoff line CL2. This is because the optical axis Ax of the vehicle illumination lamp 110 is disposed so as to extend in a direction oriented approximately 0.5 to 0.6 degrees downward in relation to the longitudinal direction of the vehicle.

Meanwhile, in the light distribution pattern Pb, a plurality of curves formed substantially concentrically with a curve representing the outline of the light distribution pattern Pb are iso-intensity curves. The iso-intensity curves indicate that the light distribution pattern Pb is gradually increased in brightness from its outer peripheral edge to its center.

When the configuration of the present modification is employed, the light distribution pattern Pb having the sharp oblique cutoff line CL4 can be formed as the reversed projection image of the upper edge 128a of the light-shielding film 128.

Meanwhile, when the vehicle illumination lamp 110 is employed while being assembled as a portion of a headlamp together with the vehicle illumination lamp 10 according to the above embodiment, the light distribution pattern Pa having the sharp horizontal cutoff line CL3 and the light distribution pattern Pb having the sharp oblique cutoff line CL4 can be formed simultaneously. As a result, formation of the hot zone HZ of the low-beam light distribution pattern PL is further facilitated.

Next, a second modification of the exemplary embodiment will be described.

Figure 9B:
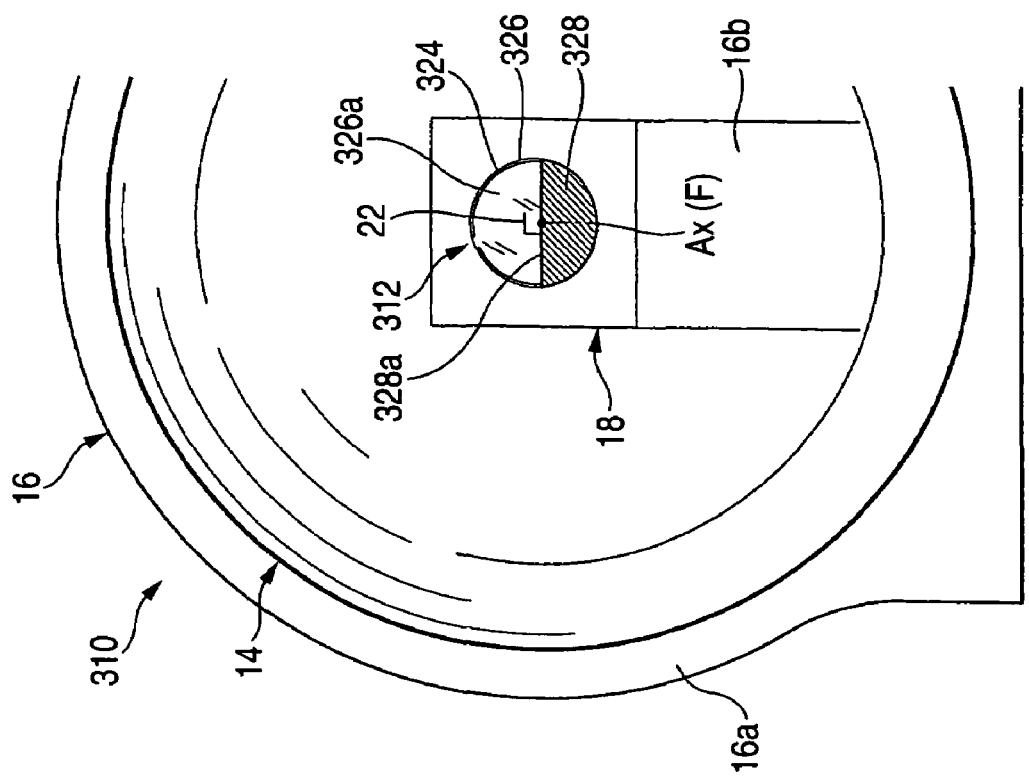
FIG. 9B is front view illustrating a vehicle illumination lamp according to a third modification of the exemplary embodiment.
Figure 9A:
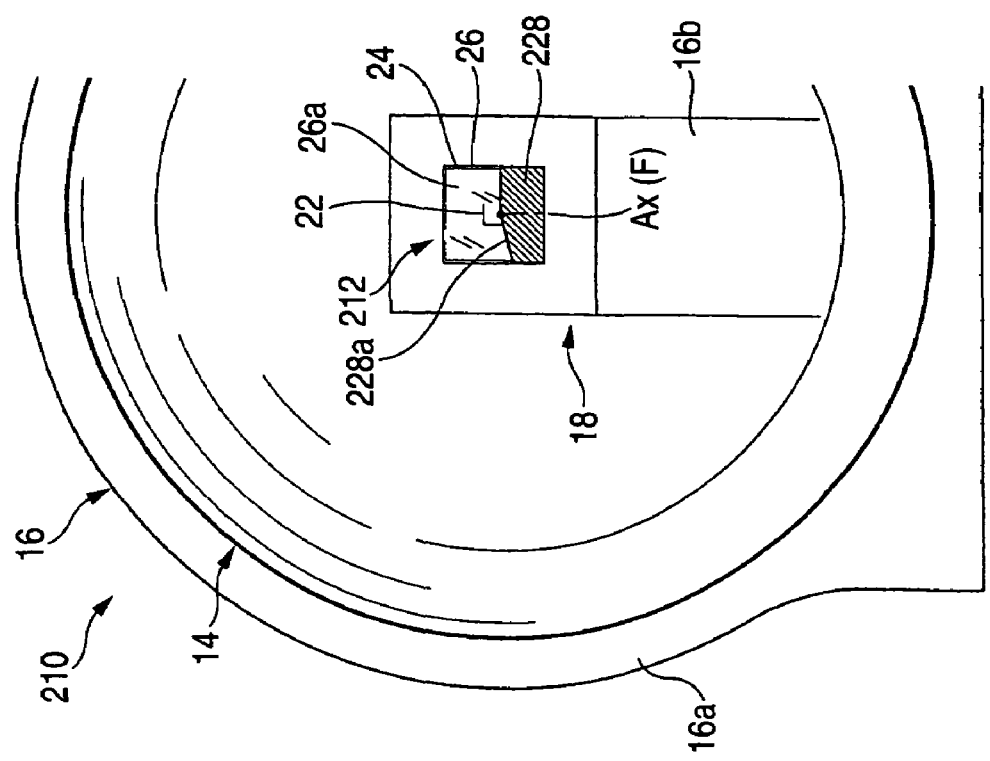
FIG. 9A is a front view illustrating a vehicle illumination lamp according to a second modification of the exemplary embodiment.

FIG. 9A is a front view illustrating a vehicle illumination lamp 210 according to the present modification.

As illustrated in the drawing, the vehicle illumination lamp 210 has a light-emitting element 212 which differs in configuration from the light-emitting element 12 of the above embodiment. However, the remaining elements are completely analogous in configuration with those of the above embodiment.

The light-emitting element 212 of the present modification differs from the light-emitting element 12 of the above embodiment in the shape of an upper edge 228a of a light-shielding film 228.

More specifically, the upper edge 228a of the light-shielding film 228 extends so as to pass through the rear focal point F in such a manner that a portion of the upper edge 228a to the left of the rear focal point F extends rectilinearly in the horizontal direction; whereas a portion of the same to the right of the rear focal point F extends rectilinearly in a direction tilted downwardly to the right by a predetermined angle in relation to the horizontal direction. Meanwhile, in other respects, the light-emitting element 212 is completely analogous in configuration with the above exemplary embodiment.

When the present modification is employed, a light distribution pattern having sharp horizontal and oblique cutoff lines can be formed as a reversed projection image of the upper edge 228a of the light-shielding film 228.

Next, a third modification of the exemplary embodiment will be described.

FIG. 9B is a front view illustrating a vehicle illumination lamp 310 according to the present modification.

As illustrated in the drawing, the vehicle illumination lamp 310 has a light-emitting element 312 which differs in configuration from the light-emitting element 12 of the above embodiment. However, the remaining elements are completely analogous in configuration with those of the above embodiment.

The light-emitting element 312 of the present modification differs from the light-emitting element 12 of the above embodiment in that a base member 324 and a translucent cover 326 respectively have circular geometries when viewed from the front. Meanwhile, the light-emitting element 312 is analogous with that of the above embodiment in that the translucent cover 326 is disposed such that its planar section 326a has a predetermined clearance from the light-emitting chip 22 so as to orthogonally intersect the optical axis Ax at the rear focal point F. In addition, the light-emitting element 312 is analogous with the light-emitting element 12 of the above embodiment in terms of the position and shape of an upper edge 328a of a light-shielding film 328 and other elements of the configuration of the light-emitting element 312.

Also when the present modification is employed, as in the case of the above exemplary embodiment, a light distribution pattern having a sharp horizontal cutoff line can be formed as a reversed projection image of the upper edge 328a of the light-shielding film 328.

In addition, in a case where the configuration of the present modification is employed, by attaching the translucent cover 326 to the base member 324 in a state of being rotated by a predetermined angle from the illustrated state, a light distribution pattern having a sharp oblique cutoff line can be formed as a reversed projection image of the upper edge 328a of the light-shielding film 328. As a result, an attempt can be made to enable the translucent cover 326 to fulfill different functions.

While the invention has been described with reference to the exemplary embodiment and modifications thereof, the technical scope of the invention is not restricted to the description of the exemplary embodiment and modifications. It is apparent to the skilled in the art that various changes or improvements can be made. It is apparent from the description of claims that the changed or improved configurations can also be included in the technical scope of the invention.

What is claimed is:

1. A vehicle illumination lamp, comprising:
    a projection lens disposed on an optical axis extending in a longitudinal direction of said lamp, and
    a light-emitting element disposed to the rear of said projection lens, wherein said light-emitting element comprises
        a light-emitting chip disposed adjacent to the rear of a rear focal point of said projection lens on said optical axis;
        a translucent cover for covering said light-emitting chip from a front side, there being a predetermined clearance between said translucent cover and said light-emitting chip, and
        a light-shielding film formed on a lower region of said translucent cover;
    wherein said translucent cover is disposed so as to intersect said optical axis at said rear focal point; and
    said light-shielding film is formed such that an upper edge of said light-shielding film passes through said rear focal point.

2. The vehicle illumination lamp according to claim 1, wherein said translucent cover has a planar section which intersects said optical axis at said rear focal point, at substantially a right angle.

3. The vehicle illumination lamp according to claim 1, wherein said light-emitting chip is disposed so as to displace a luminance center of said light-emitting chip upward from said optical axis.

4. The vehicle illumination lamp according to claim 2, wherein said light-emitting chip is disposed so as to displace a luminance center of said light-emitting chip upward from said optical axis.

5. An illumination lamp, comprising:
    a projection lens disposed on an optical axis extending in a longitudinal direction of said lamp, and
    a light-emitting element disposed to the rear of said projection lens, wherein said light-emitting element comprises
        a light-emitting chip disposed adjacent to the rear of a rear focal point of said projection lens on said optical axis;
        a translucent cover for covering said light-emitting chip from a front side, there being a predetermined clearance between said translucent cover and said light-emitting chip, and
        a light-shielding film formed on said translucent cover;
    wherein said translucent cover is disposed so as to intersect said optical axis at said rear focal point; and
    said light-shielding film is formed such that an edge of said light-shielding film passes through said rear focal point.

6. The illumination lamp according to claim 5, wherein said translucent cover has a planar section which intersects said optical axis at said rear focal point, at substantially a right angle.

7. The illumination lamp according to claim 5, wherein said light-emitting chip is disposed so as to displace a luminance center of said light-emitting chip from said optical axis.

8. The illumination lamp according to claim 6, wherein said light-emitting chip is disposed so as to displace a luminance center of said light-emitting chip from said optical axis.

* * * * *